United States Patent
Seckel

(10) Patent No.: US 11,860,460 B2
(45) Date of Patent: Jan. 2, 2024

(54) BUTTON DECK ASSEMBLY FOR AN ELECTRONIC GAMING MACHINE AND METHOD FOR MAKING THE SAME

(71) Applicant: Aristocrat Technologies Australia Pty Limited, North Ryde (AU)

(72) Inventor: Timothy Seckel, Streamwood, IL (US)

(73) Assignee: Aristocrat Technologies Australia Pty Limited, North Ryde (AU)

( * ) Notice: Subject to any disclaimer, the term of this patent is extended or adjusted under 35 U.S.C. 154(b) by 0 days.

(21) Appl. No.: 17/741,175

(22) Filed: May 10, 2022

(65) Prior Publication Data

US 2022/0269124 A1 Aug. 25, 2022

Related U.S. Application Data

(63) Continuation of application No. 17/148,232, filed on Jan. 13, 2021, now Pat. No. 11,347,091, which is a
(Continued)

(51) Int. Cl.
*H05K 1/00* (2006.01)
*H05K 1/02* (2006.01)
(Continued)

(52) U.S. Cl.
CPC .... *G02F 1/133308* (2013.01); *G02F 1/13452* (2013.01); *G07F 17/3209* (2013.01);
(Continued)

(58) Field of Classification Search
CPC .. H05K 1/00; H05K 1/02; H05K 1/18; H05K 3/361; G02F 1/46; G02F 1/13332;
(Continued)

(56) References Cited

U.S. PATENT DOCUMENTS 4,103,268 A * 7/1978 Anders ................. H01F 41/04
29/605
D327,508 S 6/1992 Mirando
(Continued)

OTHER PUBLICATIONS

Notice of Allowance dated Nov. 30, 2020 for U.S. Appl. No. 16/579,290 (pp. 1-15).
(Continued)

*Primary Examiner* — Xiaoliang Chen
(74) *Attorney, Agent, or Firm* — Armstrong Teasdale LLP

(57) ABSTRACT

A button deck assembly includes a button deck having at least one mechanical pushbutton, the pushbutton includes a lens cap, a liquid-crystal display (LCD) panel, and an optical block configured to transmit images from the LCD panel for display through the lens cap, a bottom surface of the optical block is positioned on the LCD panel, an air gap is defined between a top surface of the optical block and the lens cap. The assembly also includes a printed circuit board (PCB) assembly defining a PCB aperture, the PCB aperture is sized to receive the optical block, and an elastomeric membrane defining a membrane aperture sized to receive the optical block, the optical block extends from the LCD panel through the PCB and membrane apertures, the membrane channels fluid flow to outer edges of the membrane and around the PCB assembly and the LCD panel.

20 Claims, 10 Drawing Sheets

Related U.S. Application Data continuation of application No. 16/579,290, filed on Sep. 23, 2019, now Pat. No. 10,901,253.

(60) Provisional application No. 62/740,140, filed on Oct. 2, 2018.

(51) Int. Cl.

| | |
|---|---|
| *H05K 1/18* | (2006.01) |
| *H01H 13/83* | (2006.01) |
| *H01H 13/86* | (2006.01) |
| *H01H 13/7057* | (2006.01) |
| *G02F 1/1333* | (2006.01) |
| *G02F 1/1345* | (2006.01) |
| *H05K 3/36* | (2006.01) |
| *H01H 9/18* | (2006.01) |
| *G07F 17/32* | (2006.01) |

(52) U.S. Cl.
CPC ...... *G07F 17/3211* (2013.01); *G07F 17/3216* (2013.01); *H01H 9/181* (2013.01); *H05K 3/361* (2013.01); *G02F 1/13332* (2021.01); *G02F 2201/46* (2013.01)

(58) Field of Classification Search
CPC ........... G02F 1/133308; G02F 1/13452; G06F 1/169; G06F 1/1626; G06F 1/1662; G06F 3/0202; G06F 3/0219; G06F 3/0227; G06F 3/0233; G06F 3/0412; G06F 3/03547; F07F 17/32; F07F 17/34; F07F 17/323; F07F 17/3209; F07F 17/3211; F07F 17/3216; H01H 9/181; H01H 13/023; H01H 13/83; H01H 13/86; H01H 13/7057
USPC ......... 361/622; 200/310, 313, 314; 345/168, 345/169; 463/25, 30, 31, 37, 40
See application file for complete search history.

(56) References Cited

U.S. PATENT DOCUMENTS

| | | | | |
|---|---|---|---|---|
| 5,381,325 | A | * | 1/1995 | Messana .................. F21V 29/83 |
| | | | | 362/389 |
| 5,709,056 | A | * | 1/1998 | Matsuyama .............. E04B 2/88 |
| | | | | 52/235 |
| D411,257 | S | | 6/1999 | Nolte |
| D417,145 | S | | 11/1999 | McLaughlin |
| 5,984,782 | A | | 11/1999 | Inoue |
| D424,122 | S | | 5/2000 | Dickenson |
| D428,062 | S | | 7/2000 | Hayashi |
| D451,148 | S | | 11/2001 | Hedrick |
| D451,153 | S | | 11/2001 | Hedrick |
| D459,402 | S | | 6/2002 | Wurz |
| D460,496 | S | | 7/2002 | Cole |
| 6,772,448 | B1 | * | 8/2004 | Hockaday ................ A61F 9/028 |
| | | | | 2/435 |
| D495,755 | S | | 9/2004 | Wurz |
| D508,269 | S | | 8/2005 | Wichinsky |
| D515,144 | S | | 2/2006 | Boyd |
| D525,665 | S | | 7/2006 | Karlsson |
| D535,338 | S | | 1/2007 | Linard |
| D549,785 | S | | 8/2007 | Luciano, Jr. |
| RE40,625 | E | | 1/2009 | Wurz |
| D616,036 | S | | 5/2010 | Cha |
| D621,882 | S | | 8/2010 | Williamson |
| D622,781 | S | | 8/2010 | Lesley |
| D626,603 | S | | 11/2010 | Bruzzese |
| D632,342 | S | | 2/2011 | Wen |
| 7,892,096 | B2 | * | 2/2011 | Rigsby ................ G07F 17/3209 |
| | | | | 463/16 |
| D636,822 | S | | 4/2011 | Levitan |
| D693,884 | S | | 11/2013 | Galdini Ferrazoli |
| D704,273 | S | | 5/2014 | Chudek |
| D721,767 | S | | 1/2015 | Ferrazoli |
| 8,951,121 | B2 | | 2/2015 | Lyons |
| D727,431 | S | | 4/2015 | Themann |
| D740,887 | S | | 10/2015 | Randazzo |
| 9,589,414 | B2 | | 3/2017 | Kelly |
| D801,436 | S | | 10/2017 | Stephenson, III |
| 9,821,221 | B2 | | 11/2017 | Patton |
| 9,824,523 | B2 | | 11/2017 | Cannon |
| D818,048 | S | | 5/2018 | Calhoun |
| D822,766 | S | | 7/2018 | Costa |
| D827,719 | S | | 9/2018 | Costa |
| D854,620 | S | | 7/2019 | Yeh |
| D872,188 | S | | 1/2020 | Bernard |
| D872,189 | S | | 1/2020 | Bernard |
| D873,921 | S | | 1/2020 | Bernard |
| 10,559,165 | B1 | | 2/2020 | Kelley |
| D878,473 | S | | 3/2020 | Theoni |
| D880,609 | S | | 4/2020 | Bernard |
| D880,612 | S | | 4/2020 | Bernard |
| D880,614 | S | | 4/2020 | Bernard |
| D881,995 | S | | 4/2020 | Bernard |
| D883,391 | S | | 5/2020 | Urban |
| D886,905 | S | | 6/2020 | Bernard |
| D887,496 | S | | 6/2020 | Urban |
| D893,628 | S | | 8/2020 | Thoeni |
| D898,123 | S | | 10/2020 | Butler |
| D909,479 | S | | 2/2021 | Abele |
| D928,233 | S | | 8/2021 | Park |
| D948,621 | S | | 4/2022 | Jadeja |
| D951,358 | S | | 5/2022 | Hemerick |
| D954,830 | S | | 6/2022 | Bussey |
| D967,901 | S | | 10/2022 | Hussey |
| D976,324 | S | | 1/2023 | Bussey |
| D976,329 | S | | 1/2023 | Schoonmaker |
| D977,013 | S | | 1/2023 | Schoonmaker |
| D977,014 | S | | 1/2023 | Bussey |
| D977,579 | S | | 2/2023 | Schoonmaker |
| D977,580 | S | | 2/2023 | Urban |
| D978,248 | S | | 2/2023 | Urban |
| D978,249 | S | | 2/2023 | Urban |
| D990,577 | S | | 6/2023 | Baerlocher |
| 2005/0230233 | A1 | | 10/2005 | Hoehne |
| 2006/0202968 | A1 | * | 9/2006 | Skillman ............... G06F 3/0233 |
| | | | | 345/168 |
| 2006/0204303 | A1 | * | 9/2006 | Yurochko ............... H01H 13/83 |
| | | | | 400/49 |
| 2006/0281559 | A1 | | 12/2006 | Luciano |
| 2006/0289283 | A1 | * | 12/2006 | Jung ..................... G06F 1/1626 |
| | | | | 200/313 |
| 2008/0113737 | A1 | | 5/2008 | Waxman |
| 2008/0113766 | A1 | | 5/2008 | Waxman |
| 2008/0131184 | A1 | | 6/2008 | Brown |
| 2008/0311987 | A1 | | 12/2008 | Hirato |
| 2009/0124396 | A1 | | 5/2009 | Vetter |
| 2009/0131168 | A1 | | 5/2009 | Waxman |
| 2009/0227346 | A1 | | 9/2009 | Yoshizawa |
| 2009/0258697 | A1 | | 10/2009 | Kelly |
| 2010/0029361 | A1 | | 2/2010 | Anderson |
| 2010/0120530 | A1 | | 5/2010 | Lesley |
| 2010/0124962 | A1 | | 5/2010 | Chudek |
| 2010/0126836 | A1 | * | 5/2010 | Jung ..................... H01H 13/83 |
| | | | | 200/314 |
| 2010/0267449 | A1 | | 10/2010 | Gagner |
| 2010/0291992 | A1 | * | 11/2010 | Greenberg ............. G07F 17/32 |
| | | | | 463/30 |
| 2011/0074608 | A1 | * | 3/2011 | Kawamura ........... G06F 3/0202 |
| | | | | 341/22 |
| 2011/0111852 | A1 | | 5/2011 | Cohen |
| 2011/0117994 | A1 | | 5/2011 | Harvey |
| 2011/0148766 | A1 | * | 6/2011 | Huang .................. G06F 3/0202 |
| | | | | 345/168 |
| 2011/0157056 | A1 | | 6/2011 | Karpfinger |
| 2011/0269543 | A1 | | 11/2011 | Johnson |
| 2012/0004033 | A1 | | 1/2012 | Lyons |
| 2012/0050167 | A1 | * | 3/2012 | Krahenbuhl ........ G06F 3/03547 |
| | | | | 345/169 |

(56) References Cited

U.S. PATENT DOCUMENTS

| | | | |
|---|---|---|---|
| 2012/0067984 A1* | 3/2012 | Matusch | A61M 5/3129 |
| | | | 239/590 |
| 2012/0101431 A1* | 4/2012 | Matusch | A61M 5/30 |
| | | | 141/2 |
| 2013/0029747 A1 | 1/2013 | Kelly | |
| 2013/0029748 A1 | 1/2013 | Kelly | |
| 2013/0217491 A1 | 8/2013 | Hilbert | |
| 2014/0179429 A1* | 6/2014 | Okazaki | G07F 17/3209 |
| | | | 463/31 |
| 2015/0086823 A1* | 3/2015 | Liew | H01M 10/54 |
| | | | 429/99 |
| 2015/0228153 A1 | 8/2015 | Hedrick | |
| 2015/0261297 A1 | 9/2015 | Quek | |
| 2016/0335844 A1* | 11/2016 | Onoyama | H01H 13/83 |
| 2016/0335845 A1* | 11/2016 | Onoyama | G07F 17/3211 |
| 2017/0224990 A1* | 8/2017 | Goldwasser | A61N 1/0476 |
| 2018/0078854 A1 | 3/2018 | Achmueller | |
| 2019/0026989 A1 | 1/2019 | Humphrey | |
| 2019/0066433 A1* | 2/2019 | Jadeja | G07F 17/3211 |
| 2019/0080547 A1 | 3/2019 | Urban | |
| 2019/0080549 A1* | 3/2019 | Lewis | H01H 13/023 |
| 2019/0086433 A1 | 3/2019 | Pius | |
| 2019/0096161 A1 | 3/2019 | Barbour | |
| 2019/0102967 A1 | 4/2019 | Lyons | |
| 2019/0102969 A1 | 4/2019 | Andre | |
| 2019/0385401 A1 | 12/2019 | Winston | |

OTHER PUBLICATIONS

Office Action dated Jun. 1, 2021 for US App. No. 16/809, 183 (pp. 1-20).
Office Action (Notice of Allowance and Fees Due (PTOL-85)) dated Nov. 3, 2021 for U.S. Appl. No. 16/809,183 (pp. 1-8).
"Button Deck Assembly for an Electronic Gaming Machine and Method for Making the Same", U.S. Appl. No. 18/579,290, filed Sep. 23, 2019.
Office Action (Non-Final Rejection) dated Oct. 26, 2022 for U.S. Appl. No. 17/573,437 (pp. 1-11).
Office Action (Final Rejection) dated Mar. 23, 2023 for U.S. Appl. No. 17/573,437 (pp. 1-6).
Office Action (Notice of Allowance and Fees Due (PTOL-85)) dated Apr. 5, 2023 for U.S. Appl. No. 17/573,437 (pp. 1-8).
Office Action dated Aug. 25, 2023 for U.S. Appl. No. 29/731,291 (pp. 1-7).

* cited by examiner

BUTTON DECK ASSEMBLY FOR AN ELECTRONIC GAMING MACHINE AND METHOD FOR MAKING THE SAME

CROSS-REFERENCE TO RELATED APPLICATIONS

This application is a continuation of and claims priority to U.S. patent application Ser. No. 17/148,232, filed Jan. 13, 2021, which is a continuation of U.S. patent application Ser. No. 16/579,290, filed Sep. 23, 2019, which claims priority to U.S. Provisional Patent Application No. 62/740,140, filed Oct. 2, 2018, each of which are hereby incorporated by reference in their entireties.

TECHNICAL FIELD

The field of disclosure relates generally to electronic gaming, and more particularly, to electronic gaming machines having a button deck assembly.

BACKGROUND

Electronic gaming machines (EGMs), or gaming devices, provide a variety of wagering games such as, for example, and without limitation, slot games, video poker games, video blackjack games, roulette games, video bingo games, keno games, and other types of games that are frequently offered at casinos and other locations. Play on EGMs typically involves a player establishing a credit balance by inserting or otherwise submitting money and placing a monetary wager (deducted from the credit balance) on one or more outcomes of an instance, or play, of a primary game, sometimes referred to as a base game. In many games, a player may qualify for secondary games or bonus rounds by attaining a certain winning combination or other triggering event in the base game. Secondary games provide an opportunity to win additional game instances, credits, awards, jackpots, progressives, etc. Awards from any winning outcomes are typically added back to the credit balance and can be provided to the player upon completion of a gaming session or when the player wants to "cash out."

Slot games are often displayed to the player in the form of various symbols arranged in a row-by-column grid, or "matrix," which may define a plurality of symbol positions, and which may be generated by spinning a plurality of reels, each of which may correspond to a respective column of the matrix. Specific matching combinations of symbols along predetermined paths, or paylines, drawn through the matrix indicate the outcome of the game. The display typically highlights winning combinations and outcomes for ready identification by the player. Matching combinations and their corresponding awards are usually shown in a "paytable" that is available to the player for reference. Often, the player may vary his/her wager to included differing numbers of paylines and/or the amount bet on each line. By varying the wager, the player may sometimes alter the frequency or number of winning combinations, the frequency or number of secondary games, and/or the amount awarded.

Typical games use a random number generator (RNG) to randomly determine the outcome of each game. The game is designed to return a certain percentage of the amount wagered back to the player, referred to as return to player (RTP), over the course of many plays or instances of the game. The RTP and randomness of the RNG are fundamental to ensuring the fairness of the games and are therefore highly regulated. The RNG may be used to randomly determine the outcome of a game and symbols may then be selected that correspond to that outcome. Alternatively, the RNG may be used to randomly select the symbols whose resulting combinations determine the outcome. Notably, some games may include an element of skill on the part of the player and are therefore not entirely random.

For game play itself, player interfaces of EGMs typically include a number of mechanical pushbuttons for manual activation by a player to select game preferences, activate a game sequence, or otherwise provide input to the EGM. The mechanical pushbuttons are typically arranged in combination on a surface of the EGM cabinet that is often referred to as a "button deck". Some conventional button deck assemblies include dynamic mechanical pushbuttons. The appearance of these dynamic pushbuttons may be electronically changed via changing the graphics, colors, videos, or animations in a video display beneath the pushbuttons to accommodate different wagering games. EGMs are oftentimes used in bar, restaurant, and casino settings where food and/or drinks are consumed while the games are played. Accordingly, a button deck assembly that is resistant to fluid spills is desirable to prevent fluid damage to the dynamic pushbuttons and other sensitive electronics of the EGM. In particular, a button deck assembly having dynamic mechanical pushbuttons that present substantially an unlimited number of graphical themes and color schemes while reducing costs and maintenance is desirable.

SUMMARY

In one aspect, an electronic gaming machine is provided. The electronic gaming machine includes a main display, a credit input device configured to receive a credit wager, and a game controller configured to execute a wagering game. The electronic gaming machine also includes a button deck assembly configured to receive player input during play of the wagering game. The button deck assembly includes a button deck having at least one mechanical pushbutton. The at least one mechanical pushbutton includes a lens cap. The button deck assembly also includes a display panel. The button deck assembly further includes an optical block configured to transmit images from the display panel for display through the lens cap. A bottom surface of the optical block is positioned on the display panel. An air gap is defined between a top surface of the optical block and the lens cap. The button deck assembly also includes a printed circuit board (PCB) assembly defining a PCB aperture. The PCB aperture is sized to receive the optical block. The button deck assembly further includes an elastomeric membrane defining a membrane aperture sized to receive the optical block. The optical block extends from the display panel through the PCB aperture of the PCB assembly and the membrane aperture of the elastomeric membrane. The elastomeric membrane is configured to channel fluid flow to outer edges of the elastomeric membrane and around the PCB assembly and the display panel.

In another aspect, a button deck assembly is provided. The button deck assembly includes a button deck having at least one mechanical pushbutton. The at least one mechanical pushbutton includes a lens cap. The button deck assembly also includes a liquid-crystal display (LCD) panel. The button deck assembly further includes an optical block configured to transmit images from the LCD panel for display through the lens cap. A bottom surface of the optical block is positioned on the LCD panel. The button deck assembly also includes a printed circuit board (PCB) assembly defining a PCB aperture. The PCB aperture is sized to receive the optical block. The button deck assembly further includes an elastomeric membrane defining a membrane aperture sized to receive the optical block. The optical block extends from the LCD panel through the PCB aperture of the PCB assembly and the membrane aperture of the elastomeric membrane. The elastomeric membrane is configured to channel fluid flow to outer edges of the elastomeric membrane and around the PCB assembly and the LCD panel.

In yet another aspect, a method of manufacturing a dynamic liquid-crystal display (LCD) button deck assembly is provided. The method includes providing an LCD panel. The method also includes providing a printed circuit board (PCB) assembly defining a PCB aperture. The PCB aperture is sized to receive an optical block. The method further includes positioning a carrier tray between the LCD panel and the PCB assembly to secure the optical block onto the LCD panel. The carrier tray defines a tray aperture. The method also includes providing an elastomeric membrane defining a membrane aperture sized to receive the optical block. The method further includes positioning the optical block relative to the LCD panel, such that the optic block extends through the tray aperture of the carrier tray, the PCB aperture of the PCB assembly, and the membrane aperture of the elastomeric membrane.

BRIEF DESCRIPTION OF THE DRAWINGS

An example embodiment of the subject matter disclosed will now be described with reference to the accompanying drawings.

DETAILED DESCRIPTION

Figure 1:
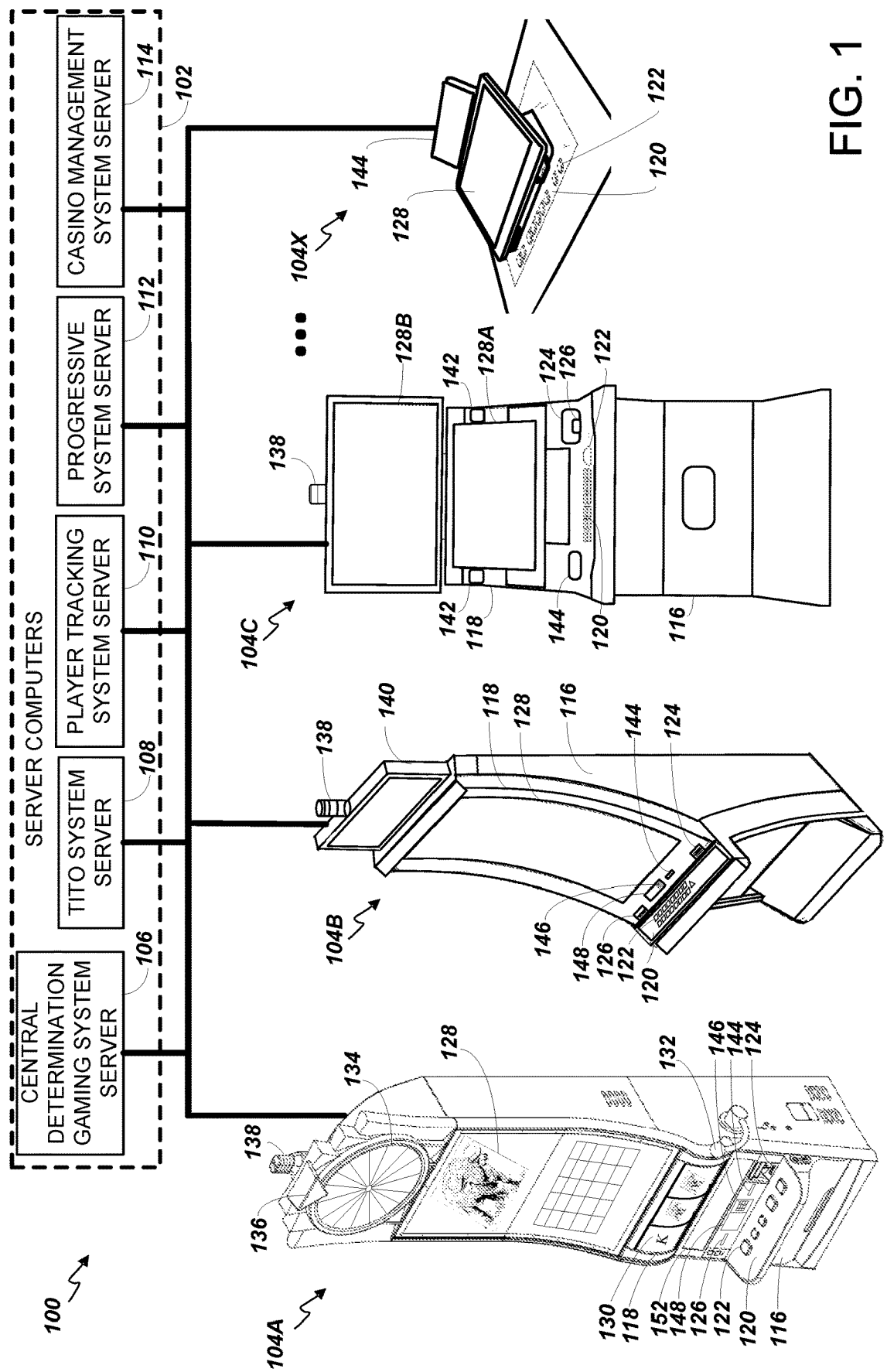
FIG. 1 is an exemplary diagram showing several EGMs networked with various gaming-related servers.

Conventional button decks for EGMs may provide printed inserts within each button to identify the nature of the button function in the context of the electronic game provided by the EGM. However, some EGMs may provide multiple different types of games (e.g., video poker, video black jack, video slots, and so forth), and each of those games may apply different uses to the same buttons. As such, printed inserts provide static content that may present difficulties to players when switching between games. Certain flat-panel display devices, such as liquid-crystal display (LCD) devices, can be used in button decks to provide configurability (e.g., dynamic text or images) for the buttons. However, EGMs and their button decks often appear in casual gaming environments where they may be subjected to spills from players and their drinks. Spills occurring on button decks can cause button failures to the EGMs due to liquid ingress, causing expensive machines to be taken out of service and leading to a loss of revenue for the operator. Liquid ingress into button decks is exacerbated in LCD-based button decks, as the liquid may ruin an expensive display.

A waterproof button deck and associated devices and methods are described herein. In an example embodiment, the waterproof button deck forms part of an electronic gaming machine (EGM). The button deck assembly described herein may include an LCD panel utilized to produce images and visual impressions for display on dynamic mechanical pushbuttons included on the button deck assembly. More specifically, optical blocks may be utilized to transfer images and visual impressions from the LCD panel in an interior of the button deck to a lens cap on the top surface of each pushbutton, such that the transmitted LCD images are visible through the pushbuttons. In the exemplary embodiment, the button deck assembly further includes a carrier tray, a printed circuit board assembly (PCBA), and an elastic membrane. Each of the carrier tray, the PCBA, and the elastic membrane define at least one aperture that is sized to receive one of the optical blocks. The optical blocks may be of various sizes and shapes. Accordingly, the apertures of each layer (e.g., the carrier tray, PCBA, and the elastic membrane) are sized to receive and securely fit around a corresponding optical block. In the exemplary embodiment, an optical block is positioned on the LCD panel and extends through an aperture of the carrier tray, an aperture of the PCBA, and an aperture of the elastic membrane, such that the optical block is positioned within a lens cap. Thus, the LCD panel and the optical block are configured to cause an image to be displayed under the lens cap of the pushbutton. When a player presses on the dynamic mechanical pushbutton, a carbon puck positioned on an underside of the membrane contacts the PCBA to facilitate switch closures, thereby generating an electronic input for the game. For example, the pushbutton may control a spin or a bet on the EGM.

FIG. 1 illustrates several different models of EGMs which may be networked to various gaming related servers. Shown is a system 100 in a gaming environment including one or more server computers 102 (e.g., slot servers of a casino) that are in communication, via a communications network, with one or more gaming devices 104A-104X (EGMs, slots, video poker, bingo machines, etc.) that can implement one or more aspects of the present disclosure. The gaming devices 104A-104X may alternatively be portable and/or remote gaming devices such as, but not limited to, a smart phone, a tablet, a laptop, or a game console, although such devices may require specialized software and/or hardware to comply with regulatory requirements regarding devices used for wagering or games of chance in which monetary awards are provided.

Communication between the gaming devices 104A-104X and the server computers 102, and among the gaming devices 104A-104X, may be direct or indirect, such as over the Internet through a website maintained by a computer on a remote server or over an online data network including commercial online service providers, Internet service providers, private networks, and the like (e.g., wide area networks). In other embodiments, the gaming devices 104A-

104X may communicate with one another and/or the server computers 102 over RF, cable TV, satellite links and the like.

In some embodiments, server computers 102 may not be necessary and/or preferred. For example, in one or more embodiments, a stand-alone gaming device such as gaming device 104A, gaming device 104B or any of the other gaming devices 104C-104X can implement one or more aspects of the present disclosure. However, it is typical to find multiple EGMs connected to networks implemented with one or more of the different server computers 102 described herein.

The server computers 102 may include a central determination gaming system server 106, a ticket-in-ticket-out (TITO) system server 108, a player tracking system server 110, a progressive system server 112, and/or a casino management system server 114. Gaming devices 104A-104X may include features to enable operation of any or all servers for use by the player and/or operator (e.g., the casino, resort, gaming establishment, tavern, pub, etc.). For example, game outcomes may be generated on a central determination gaming system server 106 and then transmitted over the network to any of a group of remote terminals or remote gaming devices 104A-104X that utilize the game outcomes and display the results to the players.

Gaming device 104A is often of a cabinet construction which may be aligned in rows or banks of similar devices for placement and operation on a casino floor. The gaming device 104A often includes a main door which provides access to the interior of the cabinet. Gaming device 104A typically includes a button area or button deck 120 accessible by a player that is configured with input switches or buttons 122, an access channel for a bill validator 124, and/or an access channel for a ticket-out printer 126.

In FIG. 1, gaming device 104A is shown as a Relm XL™ model gaming device manufactured by Aristocrat® Technologies, Inc. As shown, gaming device 104A is a reel machine having a gaming display area 118 comprising a number (typically 3 or 5) of mechanical reels 130 with various symbols displayed on them. The reels 130 are independently spun and stopped to show a set of symbols within the gaming display area 118 which may be used to determine an outcome to the game.

In many configurations, the gaming machine 104A may have a main display 128 (e.g., video display monitor) mounted to, or above, the gaming display area 118. The main display 128 can be a high-resolution LCD, plasma, LED, or OLED panel which may be flat or curved as shown, a cathode ray tube, or other conventional electronically controlled video monitor.

In some embodiments, the bill validator 124 may also function as a "ticket-in" reader that allows the player to use a casino issued credit ticket to load credits onto the gaming device 104A (e.g., in a cashless ticket ("TITO") system). In such cashless embodiments, the gaming device 104A may also include a "ticket-out" printer 126 for outputting a credit ticket when a "cash out" button is pressed. Cashless TITO systems are used to generate and track unique bar-codes or other indicators printed on tickets to allow players to avoid the use of bills and coins by loading credits using a ticket reader and cashing out credits using a ticket-out printer 126 on the gaming device 104A. The gaming machine 104A can have hardware meters for purposes including ensuring regulatory compliance and monitoring the player credit balance. In addition, there can be additional meters that record the total amount of money wagered on the gaming machine, total amount of money deposited, total amount of money withdrawn, total amount of winnings on gaming device 104A.

In some embodiments, a player tracking card reader 144, a transceiver for wireless communication with a mobile device (e.g., a player's smartphone), a keypad 146, and/or an illuminated display 148 for reading, receiving, entering, and/or displaying player tracking information is provided in EGM 104A. In such embodiments, a game controller within the gaming device 104A can communicate with the player tracking system server 110 to send and receive player tracking information.

Gaming device 104A may also include a bonus topper wheel 134. When bonus play is triggered (e.g., by a player achieving a particular outcome or set of outcomes in the primary game), bonus topper wheel 134 is operative to spin and stop with indicator arrow 136 indicating the outcome of the bonus game. Bonus topper wheel 134 is typically used to play a bonus game, but it could also be incorporated into play of the base or primary game.

A candle 138 may be mounted on the top of gaming device 104A and may be activated by a player (e.g., using a switch or one of buttons 122) to indicate to operations staff that gaming device 104A has experienced a malfunction or the player requires service. The candle 138 is also often used to indicate a jackpot has been won and to alert staff that a hand payout of an award may be needed.

There may also be one or more information panels 152 which may be a back-lit, silkscreened glass panel with lettering to indicate general game information including, for example, a game denomination (e.g., $0.25 or $1), pay lines, pay tables, and/or various game related graphics. In some embodiments, the information panel(s) 152 may be implemented as an additional video display.

Gaming devices 104A have traditionally also included a handle 132 typically mounted to the side of main cabinet 116 which may be used to initiate game play.

Figure 2:
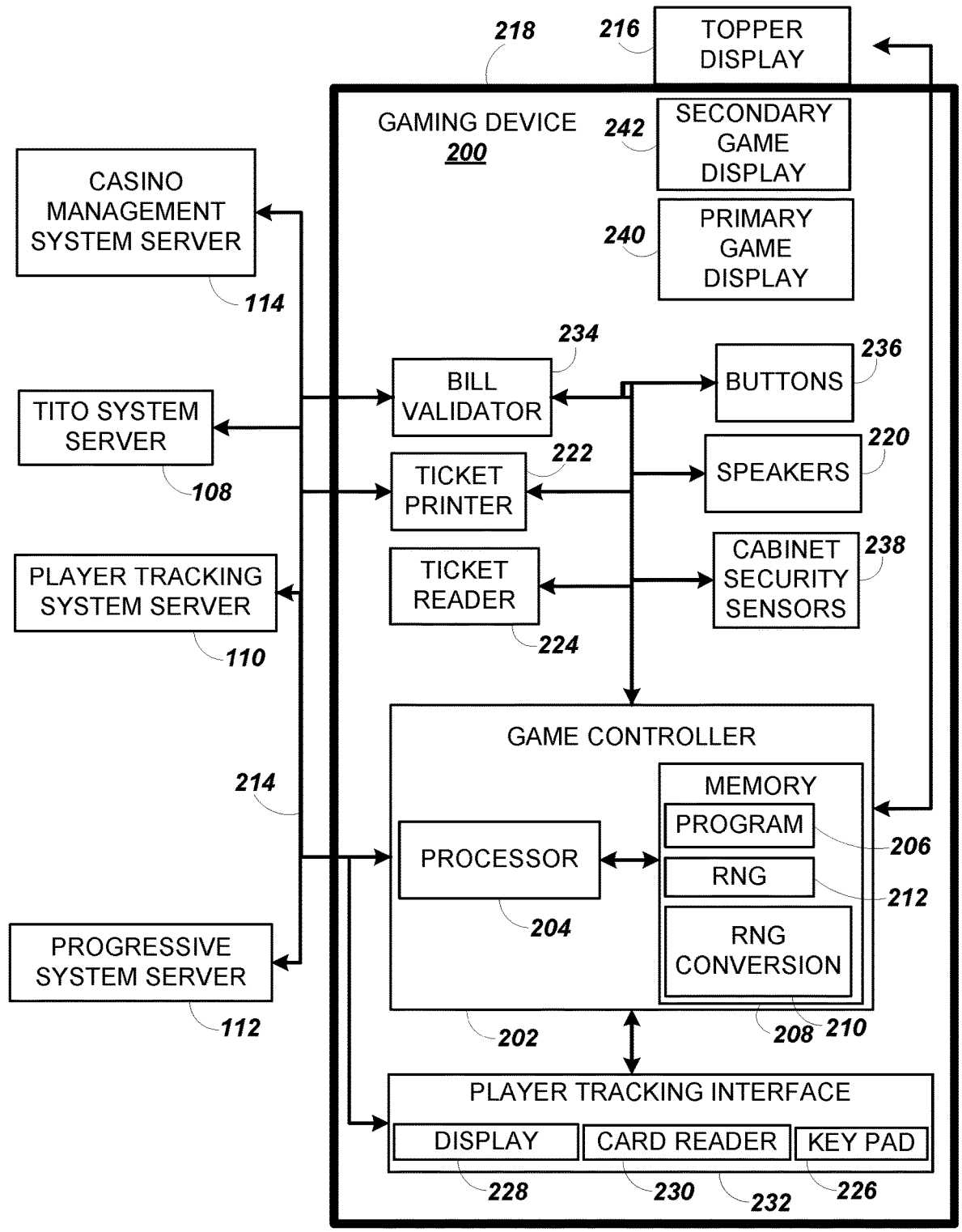
FIG. 2 is a block diagram showing various functional elements of an exemplary EGM.

Many or all the above described components can be controlled by circuitry (e.g., a gaming controller) housed inside the main cabinet 116 of the gaming device 104A, the details of which are shown in FIG. 2.

Note that not all gaming devices suitable for implementing embodiments of the present disclosure necessarily include top wheels, top boxes, information panels, cashless ticket systems, and/or player tracking systems. Further, some suitable gaming devices have only a single game display that includes only a mechanical set of reels and/or a video display, while others are designed for bar counters or table tops and have displays that face upwards.

An alternative example gaming device 104B illustrated in FIG. 1 is the Arc™ model gaming device manufactured by Aristocrat® Technologies, Inc. Note that where possible, reference numerals identifying similar features of the gaming device 104A embodiment are also identified in the gaming device 104B embodiment using the same reference numbers. Gaming device 104B does not include physical reels and instead shows game play functions on main display 128. An optional topper screen 140 may be used as a secondary game display for bonus play, to show game features or attraction activities while a game is not in play, or any other information or media desired by the game designer or operator. In some embodiments, topper screen 140 may also or alternatively be used to display progressive jackpot prizes available to a player during play of gaming device 104B.

Example gaming device 104B includes a main cabinet 116 including a main door which opens to provide access to the interior of the gaming device 104B. The main or service door is typically used by service personnel to refill the ticket-out printer 126 and collect bills and tickets inserted into the bill validator 124. The main or service door may also be accessed to reset the machine, verify and/or upgrade the software, and for general maintenance operations.

Another example gaming device 104C shown is the Helix™ model gaming device manufactured by Aristocrat® Technologies, Inc. Gaming device 104C includes a main display 128A that is in a landscape orientation. Although not illustrated by the front view provided, the landscape display 128A may have a curvature radius from top to bottom, or alternatively from side to side. In some embodiments, display 128A is a flat panel display. Main display 128A is typically used for primary game play while secondary display 128B is typically used for bonus game play, to show game features or attraction activities while the game is not in play or any other information or media desired by the game designer or operator. In some embodiments, example gaming device 104C may also include speakers 142 to output various audio such as game sound, background music, etc.

Yet another example gaming device 104X is a tabletop or bar top gaming device that may provide many different types of games, including, for example, mechanical slot games, video slot games, video poker, video black jack, video pachinko, keno, bingo, and lottery. Each gaming device 104 may also be operable to provide many different games. Games may be differentiated according to themes, sounds, graphics, type of game (e.g., slot game vs. card game vs. game with aspects of skill), denomination, number of paylines, maximum jackpot, progressive or non-progressive, bonus games, and may be deployed for operation in Class 2 or Class 3, etc.

Many different types of games, including mechanical slot games, video slot games, video poker, video black jack, video pachinko, keno, bingo, and lottery, may be provided with or implemented within the depicted gaming devices 104A-104C and other similar gaming devices. Each gaming device may also be operable to provide many different games. Games may be differentiated according to themes, sounds, graphics, type of game (e.g., slot game vs. card game vs. game with aspects of skill), denomination, number of paylines, maximum jackpot, progressive or non-progressive, bonus games, and may be deployed for operation in Class 2 or Class 3, etc.

Any of the gaming devices 104 may include a button deck 120. In the example embodiments described herein, the button deck 120 may include a button deck assembly (not separately shown in FIG. 1) that includes one or more buttons 122 that may be configurable and that may be back-lit by an LCD button deck display device within the button deck 120.

FIG. 2 is a block diagram depicting exemplary internal electronic components of a gaming device 200 connected to various external systems. All or parts of the example gaming device 200 shown could be used to implement any one of the example gaming devices 104A-X depicted in FIG. 1. As shown in FIG. 2, the gaming device 200 may include a topper display 216 or another form of a top box (e.g., a topper wheel, a topper screen, etc.) that sits above cabinet 218. The cabinet 218 or topper display 216 may also house a number of other components which may be used to add features to a game being played on gaming device 200, including speakers 220, a ticket printer 222 which prints bar-coded tickets or other media or mechanisms for storing or indicating a player's credit value, a ticket reader 224 which reads bar-coded tickets or other media or mechanisms for storing or indicating a player's credit value, and a player tracking interface 232. The player tracking interface 232 may include a keypad 226 for entering information, a player tracking display 228 for displaying information (e.g., an illuminated or video display), a card reader 230 for receiving data and/or communicating information to and from media or a device such as a smart phone enabling player tracking. A ticket printer 222 may be used to print tickets for a TITO system server 108. The gaming device 200 may further include a bill validator 234, player-input buttons 236 for player input, cabinet security sensors 238 to detect unauthorized opening of the cabinet 218, a primary game display 240, and a secondary game display 242, each coupled to and operable under the control of game controller 202.

The games available for play on the gaming device 200 are controlled by a game controller 202 that includes one or more processors 204. Processor 204 represents a general-purpose processor, a specialized processor intended to perform certain functional tasks, or a combination thereof. As an example, processor 204 can be a central processing unit (CPU) that has one or more multi-core processing units and memory mediums (e.g., cache memory) that function as buffers and/or temporary storage for data. Alternatively, processor 204 can be a specialized processor, such as an application specific integrated circuit (ASIC), graphics processing unit (GPU), field-programmable gate array (FPGA), digital signal processor (DSP), or another type of hardware accelerator. In another example, processor 204 is a system on chip (SoC) that combines and integrates one or more general-purpose processors and/or one or more specialized processors. Although FIG. 2 illustrates that game controller 202 includes a single processor 204, game controller 202 is not limited to this representation and instead can include multiple processors 204 (e.g., two or more processors).

FIG. 2 illustrates that processor 204 is operatively coupled to memory 208. Memory 208 is defined herein as including volatile and non-volatile memory and other types of non-transitory data storage components. Volatile memory is memory that do not retain data values upon loss of power. Non-volatile memory is memory that do retain data upon a loss of power. Examples of memory 208 include random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, examples of RAM include static random access memory (SRAM), dynamic random access memory (DRAM), magnetic random access memory (MRAM), and other such devices. Examples of ROM include a programmable read-only memory (PROM), an erasable programmable read-only memory (EPROM), an electrically erasable programmable read-only memory (EEPROM), or other like memory device. Even though FIG. 2 illustrates that game controller 202 includes a single memory 208, game controller 202 could include multiple memories 208 for storing program instructions and/or data.

Memory 208 can store one or more game programs 206 that provide program instructions and/or data for carrying out various embodiments (e.g., game mechanics) described herein. Stated another way, game program 206 represents an executable program stored in any portion or component of memory 208. In one or more embodiments, game program 206 is embodied in the form of source code that includes human-readable statements written in a programming language or machine code that contains numerical instructions recognizable by a suitable execution system, such as a processor 204 in a game controller or other system. Examples of executable programs include: (1) a compiled program that can be translated into machine code in a format that can be loaded into a random access portion of memory 208 and run by processor 204; (2) source code that may be expressed in proper format such as object code that is capable of being loaded into a random access portion of memory 208 and executed by processor 204; and (3) source code that may be interpreted by another executable program to generate instructions in a random access portion of memory 208 to be executed by processor 204.

Alternatively, game programs 206 can be setup to generate one or more game rounds based on instructions and/or data that gaming device 200 exchange with one or more remote gaming devices, such as a central determination gaming system server 106 (not shown in FIG. 2 but shown in FIG. 1). With regard to primary games played on the gaming device 200, the term "game round" refers to a play or a round of a game that gaming device 200 presents (e.g., via a user interface (UI)) to a player (e.g., the game play occurring after submission of a single wager). The game round is communicated to gaming device 200 via the network 214 and then displayed on gaming device 200. For example, gaming device 200 may execute game program 206 as video streaming software that allows the game to be displayed on gaming device 200. When a game is stored on gaming device 200, it may be loaded from memory 208 (e.g., from a read only memory (ROM)) or from the central determination gaming system server 106 to memory 208.

Gaming devices, such as gaming device 200, are highly regulated to ensure fairness and, in many cases, gaming device 200 is operable to award monetary awards (e.g., typically dispensed in the form of a redeemable voucher). Therefore, to satisfy security and regulatory requirements in a gaming environment, hardware and software architectures are implemented in gaming devices 200 that differ significantly from those of general-purpose computers. Adapting general purpose computers to function as gaming devices 200 is not simple or straightforward because of: (1) the regulatory requirements for gaming devices 200, (2) the harsh environment in which gaming devices 200 operate, (3) security requirements, (4) fault tolerance requirements, and (5) the requirement for additional special purpose componentry enabling functionality of an EGM. These differences require substantial engineering effort with respect to game design implementation, game mechanics, hardware components, and software.

In some jurisdictions, one regulatory requirement for games running on gaming device 200 may include complying with a certain level of randomness. Typically, gaming jurisdictions mandate that gaming devices 200 satisfy a minimum level of randomness without specifying how a gaming device 200 should achieve this level of randomness. To comply, FIG. 2 illustrates that gaming device 200 includes a random number generator (RNG) 212 that utilizes hardware and/or software to generate RNG outcomes that lack any pattern. The RNG operations are often specialized and non-generic in order to comply with regulatory and gaming requirements. For example, in a reel game, game program 206 can initiate multiple RNG calls to RNG 212 to generate RNG outcomes, where each RNG call and RNG outcome corresponds to an outcome for a reel. In another example, gaming device 200 can be a Class II gaming device where RNG 212 generates RNG outcomes for creating Bingo cards. In one or more embodiments, RNG 212 could be one of a set of RNGs operating on gaming device 200. Game developers could vary the degree of true randomness for each RNG (e.g., pseudorandom) and utilize specific RNGs depending on game requirements.

Another regulatory requirement for running games on gaming device 200 may include ensuring a certain level of return to player (RTP). Similar to the randomness requirement discussed above, numerous gaming jurisdictions also mandate that gaming device 200 provides a minimum level of RTP (e.g., RTP of at least 75%). FIG. 2 illustrates that gaming device 200 includes an RNG conversion engine 210 that translates the RNG outcome from RNG 212 to a game outcome presented to a player. To meet a designated RTP, a game developer can setup the RNG conversion engine 210 to utilize one or more lookup tables to translate the RNG outcome to a symbol element, stop position on a reel strip layout, and/or randomly chosen aspect of a game feature. As an example, the lookup tables can regulate a prize payout amount for each RNG outcome and how often the gaming device 200 pays out the prize payout amounts. The RNG conversion engine 210 could utilize one lookup table to map the RNG outcome to a game outcome displayed to a player and a second lookup table as a pay table for determining the prize payout amount for each game outcome. The mapping between the RNG outcome to the game outcome controls the frequency in hitting certain prize payout amounts.

Gaming device 200 may be connected over network 214 to player tracking system server 110. Player tracking system server 110 may be, for example, an OASIS® system manufactured by Aristocrat® Technologies, Inc. Player tracking system server 110 is used to track play (e.g. amount wagered, games played, time of play and/or other quantitative or qualitative measures) for individual players so that an operator may reward players in a loyalty program. The player may use the player tracking interface 232 to access his/her account information, activate free play, and/or request various information. Player tracking or loyalty programs seek to reward players for their play and help build brand loyalty to the gaming establishment. The rewards typically correspond to the player's level of patronage (e.g., to the player's playing frequency and/or total amount of game plays at a given casino). Player tracking rewards may be complimentary and/or discounted meals, lodging, entertainment and/or additional play. Player tracking information may be combined with other information that is now readily obtainable by a casino management system.

When a player wishes to play the gaming device 200, he/she can insert cash or a ticket voucher through a coin acceptor (not shown) or bill validator 234 to establish a credit balance on the gamine machine. The credit balance is used by the player to place wagers on rounds of the game and to receive credit awards based on the outcome of winning rounds. The credit balance is decreased by the amount of each wager and increased upon a win. The player can add additional credits to the balance at any time. The player may also optionally insert a loyalty club card into the card reader 230. During the game, the player views with one or more UIs, the game outcome on one or more of the primary game display 240 and secondary game display 242. Other game and prize information may also be displayed.

For each game round, a player may make selections, which may affect play of the game. For example, the player may vary the total amount wagered by selecting the amount bet per line and the number of lines played. In many games, the player is asked to initiate or select options during course of game play (such as spinning a wheel to begin a bonus round or select various items during a feature game). The player may make these selections using the player-input buttons 236, the primary game display 240 which may be a touch screen, or using some other device which enables a player to input information into the gaming device 200.

During certain game events, the gaming device 200 may display visual and auditory effects that can be perceived by the player. These effects add to the excitement of a game, which makes a player more likely to enjoy the playing experience. Auditory effects include various sounds that are projected by the speakers 220. Visual effects include flashing lights, strobing lights or other patterns displayed from lights on the gaming device 200 or from lights behind the information panel 152 (FIG. 1).

When the player is done, he/she cashes out the credit balance (typically by pressing a cash out button to receive a ticket from the ticket printer 222). The ticket may be "cashed-in" for money or inserted into another machine to establish a credit balance for play.

Although FIGS. 1 and 2 illustrates specific embodiments of a gaming device (e.g., gaming devices 104A-104X and 200), the disclosure is not limited to those embodiments shown in FIGS. 1 and 2. For example, not all gaming devices suitable for implementing embodiments of the present disclosure necessarily include top wheels, top boxes, information panels, cashless ticket systems, and/or player tracking systems. Further, some suitable gaming devices have only a single game display that includes only a mechanical set of reels and/or a video display, while others are designed for bar counters or table tops and have displays that face upwards. Additionally, or alternatively, gaming devices 104A-104X and 200 can include credit transceivers that wirelessly communicate (e.g., Bluetooth or other near-field communication technology) with one or more mobile devices to perform credit transactions. As an example, bill validator 234 could contain or be coupled to the credit transceiver that output credits from and/or load credits onto the gaming device 104A by communicating with a player's smartphone (e.g., a digital wallet interface). Gaming devices 104A-104X and 200 may also include other processors that are not separately shown. Using FIG. 2 as an example, gaming device 200 could include display controllers (not shown in FIG. 2) configured to receive video input signals or instructions to display images on game displays 240 and 242. Alternatively, such display controllers may be integrated into the game controller 202. The use and discussion of FIGS. 1 and 2 are examples to facilitate ease of description and explanation.

Figure 3:
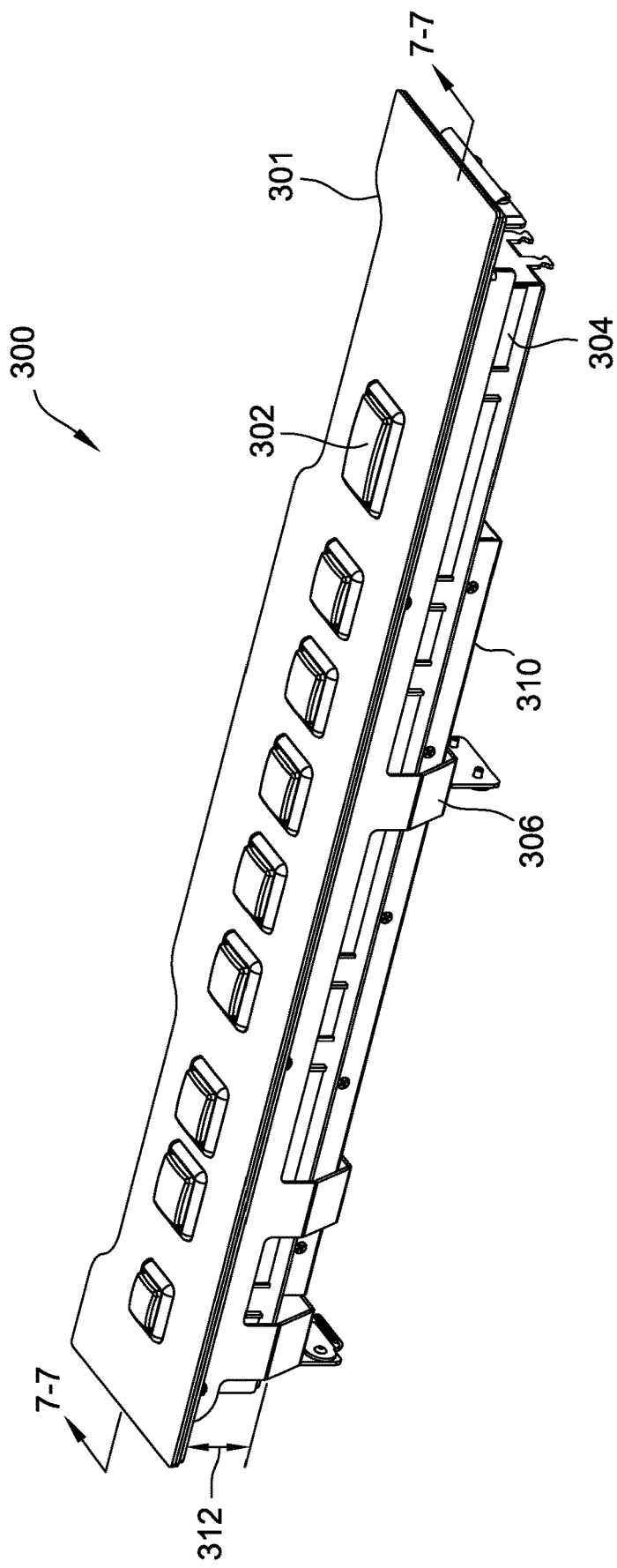
FIG. 3 is a perspective view of an exemplary button deck assembly, as shown in FIG. 1.

FIG. 3 is a perspective view 300 of an exemplary button deck assembly 301. In some embodiments, button deck assembly 301 may be similar to button deck 120 (shown in FIG. 1), and may be installed within an EGM such as gaming devices 104A-104X. In the example embodiment, button deck assembly 301 includes multiple dynamically configurable, mechanical pushbuttons 302 (similar to or the same as buttons 122, shown in FIG. 1 on button deck 120). Pushbutton 302 may include a lens cap 402 (shown in FIG. 4) and a button bezel 502 (shown in FIG. 5). Button deck assembly 301 utilizes a liquid crystal display (LCD) panel 404 (shown in FIG. 4) to produce sharp images and/or visual impressions that are visible through pushbuttons 302, and that may be configured or dynamically reconfigured for operational needs (e.g., to support particular games, to switch between different types of games). In other embodiments, button deck assembly 301 may utilize other flat panel display technology in lieu of LCD panel 404, such as organic light-emitting diode (OLED) technology. Button deck assembly 301 may include any suitable number of pushbuttons 302 of varying size, shape, and/or structure. Additionally or alternatively, pushbuttons 302 may be spaced apart in any suitable configuration.

Dynamic mechanical pushbuttons 302 may have practically any appearance desired depending on the electronic configuration of the player interface by game controller 202 (shown in FIG. 2). In some embodiments, player tracking system server 110 (shown in FIG. 1) may transmit messages and/or display attract mode sequences to pushbuttons 302 to change the appearance of pushbuttons 302. Some EGMs are configured to switch from presenting one type of wagering game, such as, for example, slot games, to another type of wagering game, such as, for example, video poker games. For example, pushbuttons configured to display prompts associated with video poker games may be electronically reconfigured to display prompts associated with slot games. In other words, a pushbutton that may display a "spin" label in one type of game may be able to display a "bet" label for a different type of game. As such, the same button deck assembly can facilitate presentation and play of multiple and different wagering games on the same EGM.

In the exemplary embodiment, an elastomeric membrane 304 protects sensitive electronics, such as a printed circuit board assembly (PCBA) 406 and optical blocks 408 (both shown in FIG. 4) from fluid infiltration (e.g., drink spills). In the exemplary embodiment, membrane 304, as explained in detail below, is a water-resistant elastomeric membrane, such as, for example, a silicone membrane, that routes liquid flow around and past sensitive internal electronics, thereby maintaining a separation between the liquid and the protected components.

Button deck 301 is electronically reconfigurable, such that pushbuttons 302 may be designated or re-designated (i.e., configured and re-configured) with clear prompts and/or information specific to different types of wagering games. For example, pushbuttons 302 may display video poker prompts, such as "hold," "bet one," "bet max," and "deal," when a player selects a video poker game. In the same example, pushbuttons 302 may be re-designated to display slot machine game prompts or visual impressions, such as a spin button, when the player selects a slot machine game. Advantageously, display panel 404 provides bright, full color images with sharp resolution. These images are projected from the display panel 404 onto (e.g., up to) the lens caps 402 of each button. Thus, as opposed to conventional button decks that are custom designed for a specific game, electronically reconfigurable button deck assembly 301 utilizes LCD technology to provide both quality images and visual impressions with substantial cost savings and protect that LCD technology and other sensitive electronics from liquid ingress.

In various embodiments, not all pushbuttons 302 provided on button deck 120 may be used. Depending on the type of wagering game selected by the player, some pushbuttons 302 may not be used for playing that particular game. Pushbuttons 302 that are not used may remain blank (e.g., no image). In other embodiments, unused pushbuttons 302 may display a static LCD image, including labels and logos, such as, for example, the Aristocrat® logo. Pushbuttons 302 that are not used during a particular wagering game may be configured to be unresponsive when actuated by a player. In further embodiments, unused pushbuttons 302 may subsequently be activated by game controller 202 to provide player attract mode displays.

Button deck assembly 301 further includes a drip tray 306 (e.g., a gutter) configured to capture and collect liquid. When liquid is spilled on top of button deck 120 and comes in contact with membrane 304, the liquid is directed to outer edges 422 and 424 (shown in FIG. 4) of membrane 304, such that the liquid runs down a height 312 of membrane 304 (along the Z-axis), outside of sensitive internal electronic components, and collects in drip tray 306 for subsequent removal. In various embodiments, drip tray 306 directs the collected liquid to one side of the gaming machine. In some embodiments, the drip tray 306 may include an outlet with a nipple coupled in flow communication with a hose leading to a collection reservoir (not shown). Thus, any liquid spilled on button deck 120, including pushbuttons 302, will generally be prevented from passing through membrane 304, and potentially damaging printed circuit board assembly (PCBA) 406, optical blocks 408, display panel 404, and other electronic components.

Figure 4:
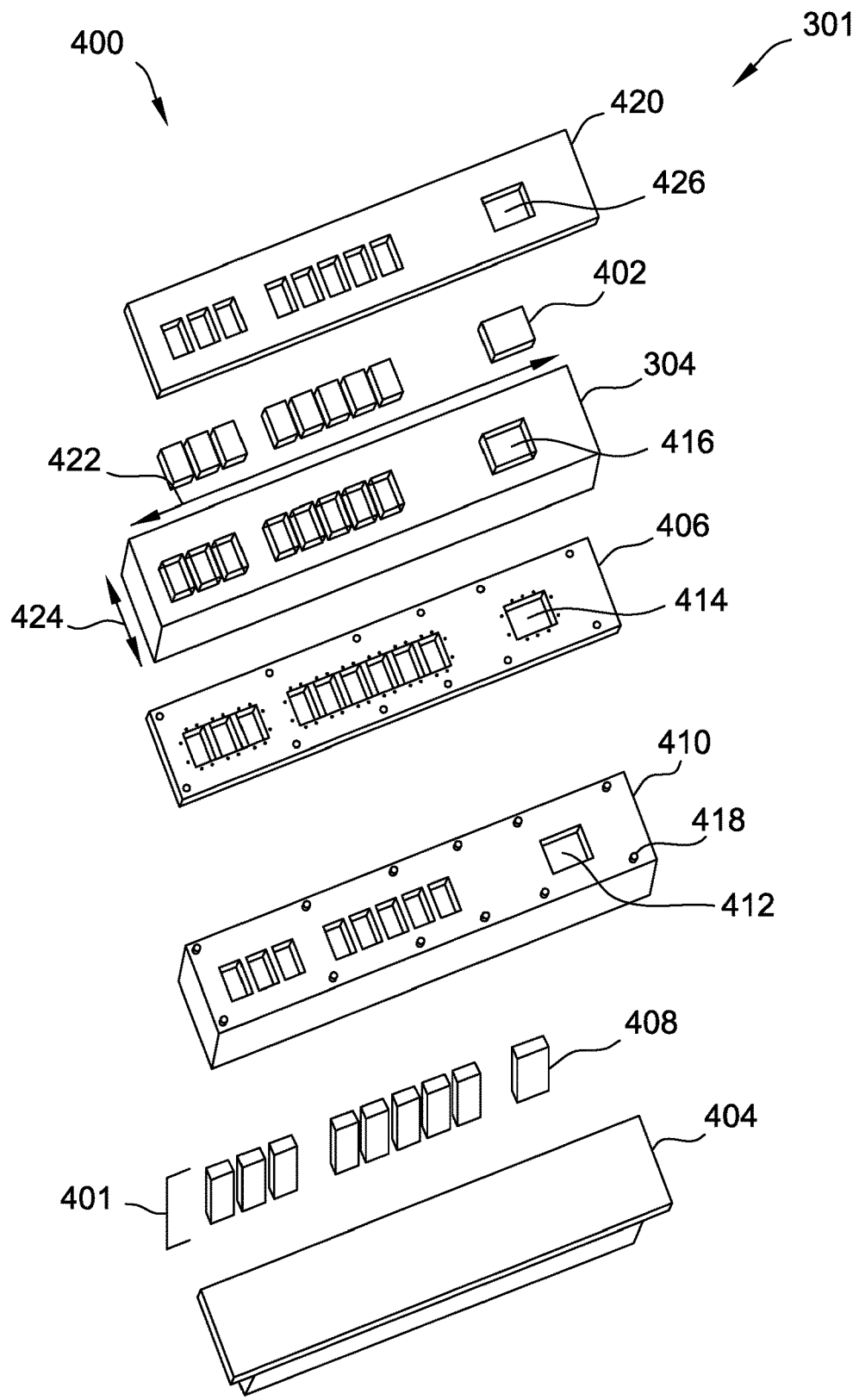
FIG. 4 is an exploded schematic view of the button deck assembly shown in FIG. 3, with certain components removed to illustrate an exemplary optical block arrangement.

FIG. 4 is an exploded schematic view 400 of button deck assembly 301, with certain components removed to illustrate an exemplary optical block arrangement 401. Button deck assembly 301 includes a display panel 404, optical blocks 408, a carrier tray 410, PCBA 406, membrane 304, lens caps 402, and a metal top plate 420. In various embodiments, metal top plate 420 may be manufactured from any suitable materials, such as, for example, plastic, zinc, and glass material. Button deck assembly 301 utilizes display panel 404 to produce full color images or visual impressions. Display panel 404 may be, for example, an LCD display or an OLED display. An optical block arrangement 401 that includes a plurality of optical blocks 408 is positioned on display panel 404. A bottom face (not shown) of each optical block 408 is in direct contact with display panel 404. Optical blocks 408 are generally elongated structures, such as, for example, rectangular prisms.

In the exemplary embodiment, each optical block 408 extends through a corresponding tray aperture 412 of the carrier tray 410, a PCBA aperture 414 of the PCBA 406, and a membrane aperture 416 of membrane 304, allowing a top surface of each block 408 to an air gap beneath one of the lens caps 402. More specifically, optical block 408 extends through carrier tray 410, PCBA 406, and membrane 304, such that an upper portion of optical block 408 protrudes from membrane 304 and sits underneath lens cap 402. Optical blocks 408 enable images from display panel 404 to be transmitted to pushbuttons 302. More specifically, optical blocks 408 transfer images from display panel 404 to an underside (not shown) of a corresponding lens cap 402, where the lens caps 402 acts as working surfaces of the push buttons 302. In the exemplary embodiment, optical block arrangement 401 includes nine optical blocks 408 in a linear configuration. Each optical block 408 corresponds to a respective lens cap 402, and accordingly, to a respective pushbutton 302. Alternatively, optical block arrangement 401 may include any number of optical blocks 408 depending on the number of pushbuttons 302 provided on button deck 120 (shown in FIG. 1).

Optical blocks 408 do not move up and down when pushbuttons 302 are actuated by a player. Rather, a bottom surface of each optical block 408 rests on a top surface of the display panel 404. Optic block 408 may be positioned in an optic block retainer 506 (shown in FIG. 5), which restricts movement of the optical block 408, keeping the optical block 408 flush with the surface of the display panel 404, where the carrier tray 410 restricts movement of the optical blocks 408 in the plane of the display panel 404. Optical blocks 408 need to be firmly secured on top of display panel 404 to transmit clear images from display panel 404 to pushbuttons 302. When optical blocks 408 are not tightly secured, images transmitted by optical blocks 408 may become blurry and distorted.

Apertures (e.g., holes) 412, 414, and 416 are sized in relation to each corresponding optical block 408. Carrier tray 410 is configured to secure optical blocks 408 to display panel 404. Optical block 408 extends through tray aperture 412, which is sized and fitted to secure optical block 408, thereby preventing optical blocks 408 from moving in a general direction of the x-axis or y-axis. Carrier tray 410 may further include mounting provisions 418, such as fasteners, to mount PCBA 406 to carrier tray 410. For example, mounting provisions 418 may include mounting holes, screws, and/or latching mechanisms to mechanically coupled and fasten PCBA 406 to carrier tray 410. Carrier tray 410 may be a plastic or metal housing or plate.

PCBA 406 is placed on top of carrier tray 410. In the exemplary embodiment, PCBA 406 includes conductive PCT (Printed Circuit Traces) pads 602 (shown in FIG. 6) to enable switch closures when a carbon puck or carbon pill (not shown) of membrane 304 contacts one or more PCT pads 602. PCT pads 602 surround a periphery of each PCBA aperture 414. In various embodiments, PCBA 406 may include light emitting diode (LED) elements (not shown) to provide distinctive visual effects. Additional details related to PCT pads 602 and LEDs are provided below with reference to FIGS. 5 and 6.

Figure 5:
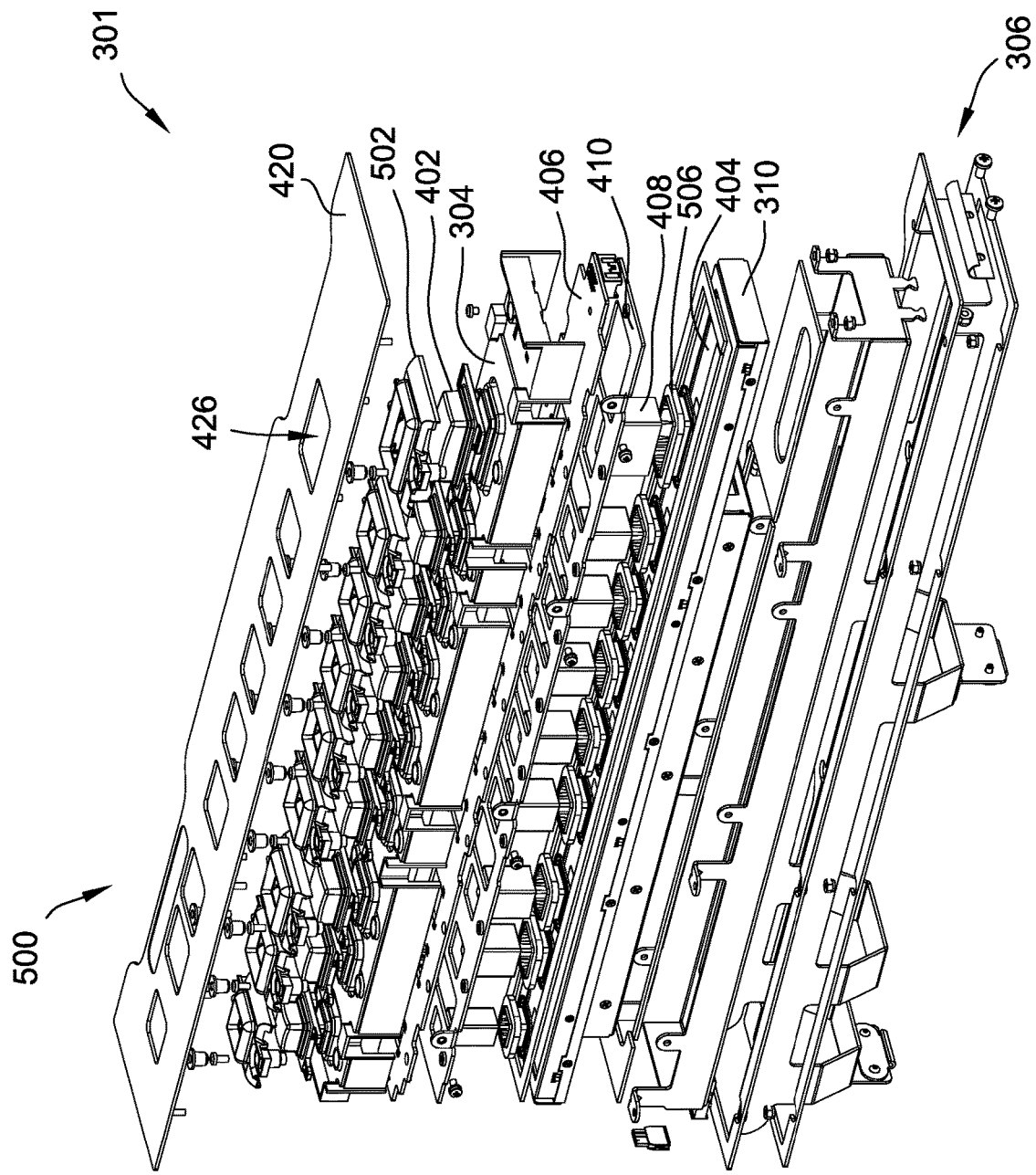
FIG. 5 is a complete exploded view of the button deck assembly shown in FIG. 3.

FIG. 5 is a complete exploded view 500 of button deck assembly 301 illustrating additional component detail. In the example embodiment, each button 302 of the button deck assembly 301 also includes a button bezel 502 disposed between the button lens 402 and the top plate 420 that frames and contains the button lens 402. Further, each optical block 408 is framed and held in place by an optical block retainer 506. The optical block retainer 506 is configured to hold the optical block 408 stationary relative to the top surface of the display panel 404.

During operation, liquid spills can occur onto the button deck assembly 301 (e.g., onto the top surface of top plate 420, onto buttons 302). Liquid ingress can occur through plate apertures 426 (e.g., between top plate 420 and button bezel 502, between button bezel 502 and button lens 402). The membrane 304 traps any such liquid paths and routes flow outward and down front and back surfaces of the membrane 304. In an assembled state, electrical components of the button deck assembly 301, such as the PCBA 406 and the display panel 404, reside underneath and within the membrane 304. As such, the membrane 304 causes such liquid flow to pass around the sensitive electrical components and down into the drop tray 306 for collection.

Figure 6:
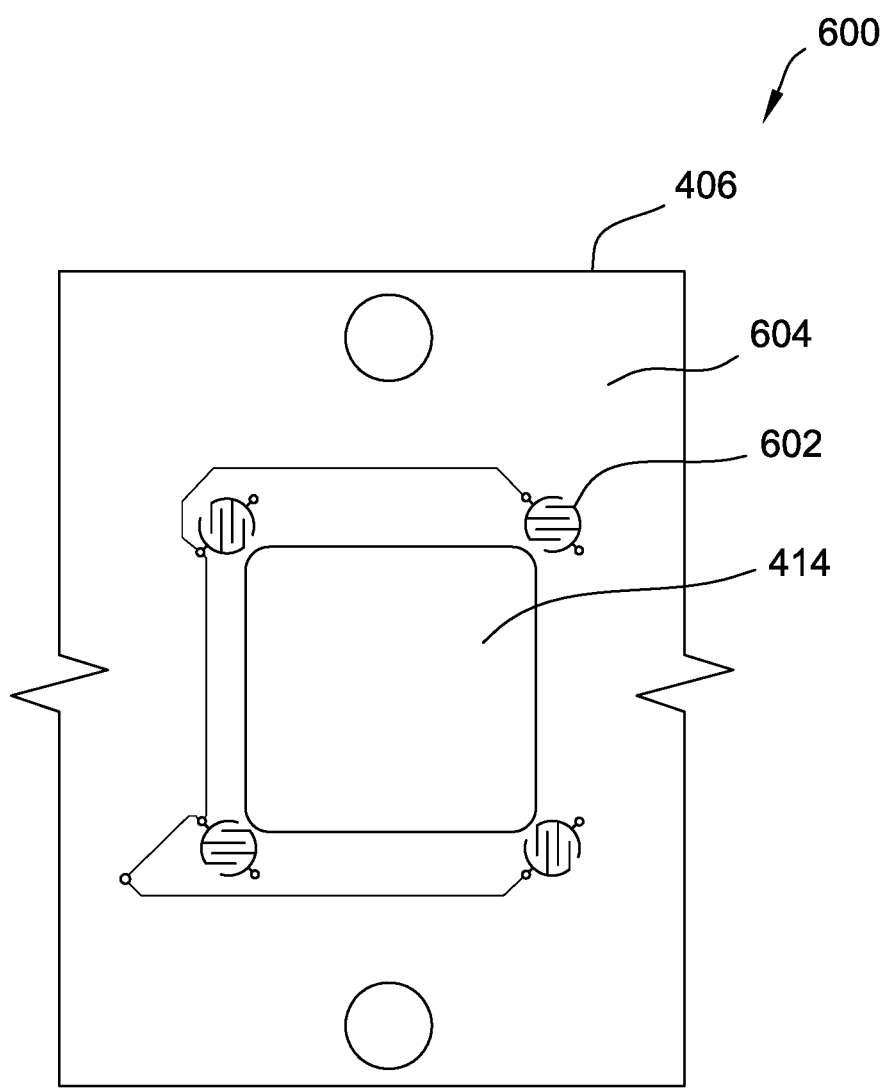
FIG. 6 is a schematic view of an exemplary Printed Circuit Traces (PCT) pad arrangement on a printed circuit board assembly (PCBA), as shown in FIG. 4 and FIG. 5.

FIG. 6 is a schematic view 600 of an exemplary PCT pad arrangement configured on a top surface 604 of PCBA 406 (shown in FIG. 4). In the exemplary embodiment, and with combined reference to FIGS. 4-6, membrane 304 has a 3-dimensional (3D) structure that extends around and securely covers PCBA 406 and carrier tray 410. Valleys, channels, and grooves are molded into membrane 304, such that membrane 304 engages with and securely fits over PCBA 406 and carrier tray 410. The configuration of membrane 304, in particular, the various channels and grooves, enable fluids to be directed to the outer edges of membrane 304 and down height 312 into drip tray 306 (all shown in FIG. 3). Accordingly, spilled fluid does not infiltrate PCBA 406, carrier tray 410, optical blocks 408, display panel 404, and the various electronic components protected by membrane 304. Rather, spilled fluid runs past the components mentioned above and gathers in drip tray 306. In the exemplary embodiment, display panel 404 sits inside an LCD housing 310.

In various embodiments, membrane 304 may be manufactured from a silicone material. For example, membrane 304 may be manufactured from a silicone material having a translucent, milk-white tint. In further embodiments, gaskets or additional sealants or waterproofing features (not shown) may also be included as desired or as needed to provide further protection to any sensitive electronics from spills on the surface of button deck 120.

As described above, an underside (not shown in FIG. 6) of membrane 304 includes carbon pucks (e.g., carbon pads) (not shown) that are configured to contact PCBA 406 when pushbutton 302 is actuated by a player. Accordingly, carbon pucks are positioned and sized to contact the periphery of each membrane aperture 416 when pushbutton 302 is actuated. More specifically, carbon pucks are configured to contact one or more PCT pads 602 of PCBA 406. PCT pads 602 are printed circuit board (PCB) configuration of traces that enable circuit closures when in contact with a conductive material, such as a carbon puck. In various embodiments, a web profile (e.g., angled webbing corresponding to pushbutton 302) (not shown) of membrane 304 is altered to vary the tactile response when pushbutton 302 is actuated by a player. For example, the web profile of membrane 304 may be altered to create varying levels of resistance and produce stiffer or weaker tactile feedbacks when a carbon puck comes in contact with PCT pads 602 on PCBA 406.

As shown in FIG. 6, PCT pads 602 may be circular in shape, and include intertwined finger-like PCB traces. For pushbuttons 302 having a generally square shape, PCT pads 602 are positioned at the four corners of PCBA aperture 414 to facilitate switch closure. PCT pads 602 are positioned at each corner to ensure that a corresponding carbon puck of membrane 304 contacts at least one PCT pad 602 when a player presses down on pushbutton 302. For example, if a player presses a middle portion of pushbutton 302, all four PCT pads 602 may come in contact with a carbon puck. In another example, if a player presses down on any side and/or corner portion of pushbutton 302, at least two PCT pads 602 come in contact with a carbon puck. Accordingly, four carbon rods (e.g., elastomer rods) are provided for pushbuttons 302 that are substantially square-shaped. More specifically, four carbon rods or posts move downward along with the carbon puck when pushbutton 302 is actuated by a player.

In various embodiments, button deck assembly 301 includes pushbuttons 302 that have a substantially rectangle shape. In these embodiments, six PCT pads 602 may be provided around the periphery of PCBA aperture 414 to facilitate switch closure. In particular, in addition to including PCT pads 602 for each corner, two additional PCT pads 602 may be provided near a center of the pushbutton 302 along a long axis. Accordingly, six carbon rods are provided for pushbuttons 302 that are substantially rectangle-shaped. PCT pads 602 can be arranged such that each PCT pad 602 is equally spaced apart from one another.

As opposed to conventional LCD button decks that implement a touch sensor film on top of an LCD panel, such as display panel 404, costs and maintenance are reduced because carbon pucks of membrane 304 eliminate the need for touch sensor films. More specifically, carbon pucks act as switch contacts that interact with PCT pads 602 to make electronic switches.

In various embodiments, PCBA 406 further includes LED elements (not shown) in addition to PCT pads 602. In some embodiments, PCBA 406 includes organic light emitting diode (OLED) elements. LED elements may be incorporated around the periphery of PCBA apertures 414 to light up button bezels 502 in different colors and light patterns. In these embodiments, membrane 304 may be configured in such a way to allow light from LED elements to shine through membrane 304 and illuminate button bezel 502. In one example, PCBA 406 may include multicolored red, green blue (RGB) lighting elements that extend around the entire perimeter of each button bezel 502 to provide accent lighting to pushbutton 302 in one of a plurality of different colors, providing for even further variability in the appearance of pushbutton 302. Additionally, lighting element may be brightened or dimmed, turned on and off, or change colors to signify different features or accentuate different aspects of a game in progress. Blinking and chasing light effects may also be implemented. Unique visual impressions to observers and potential players may draw interest to the gaming machine, apart from any LCD image or visual impression being visible through pushbutton 302. While the lighting element may enhance the dynamic appearance of pushbutton 302, it may in some instances be considered optional and need not be provided.

In the exemplary embodiment, lens caps 402 of pushbuttons 302 sit on top of membrane 304, such that a press fit is produced. More specifically, lens caps 402 may be secured to membrane 304 by an interference fit, thereby eliminating a need for mechanical fasteners and adhesives (e.g., glue). Additionally, as shown in FIG. 5, each lens cap 402 may engage with button bezel 502. Metal top plate 420 includes plate apertures 426 that are sized in relation to lens caps 402. Metal top plate 420 may be fitted over membrane 304, such that a portion of each lens cap 402 extends through a corresponding plate aperture 426.

Figure 7:
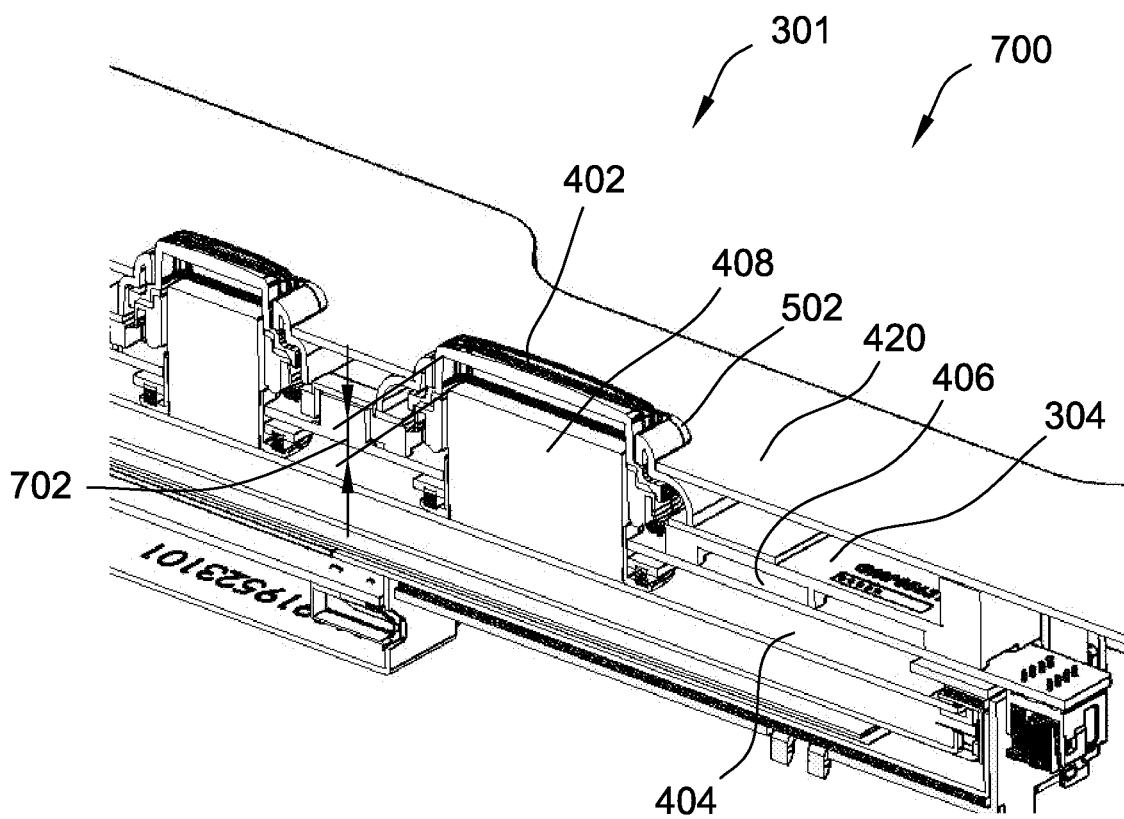
FIG. 7 is a first sectional view of a cross section of the button deck assembly shown in FIG. 3 taken across line 7-7, as shown in FIG. 3.
Figure 8A:
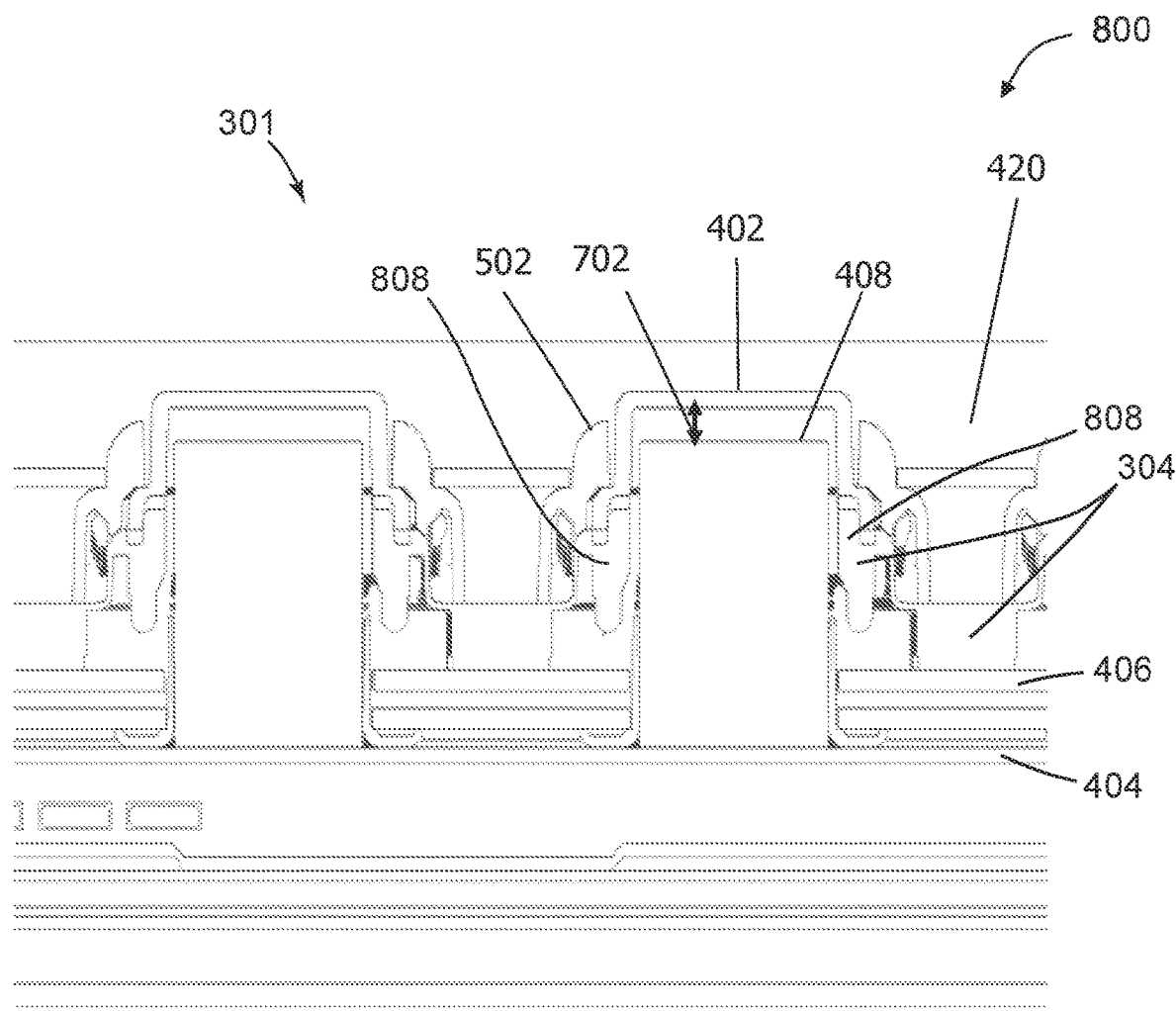
FIGS. 8A and 8B are additional sectional views of a cross section of the button deck assembly shown in FIG. 3 taken across the line 7-7, as shown in FIG. 3.
Figure 8B:
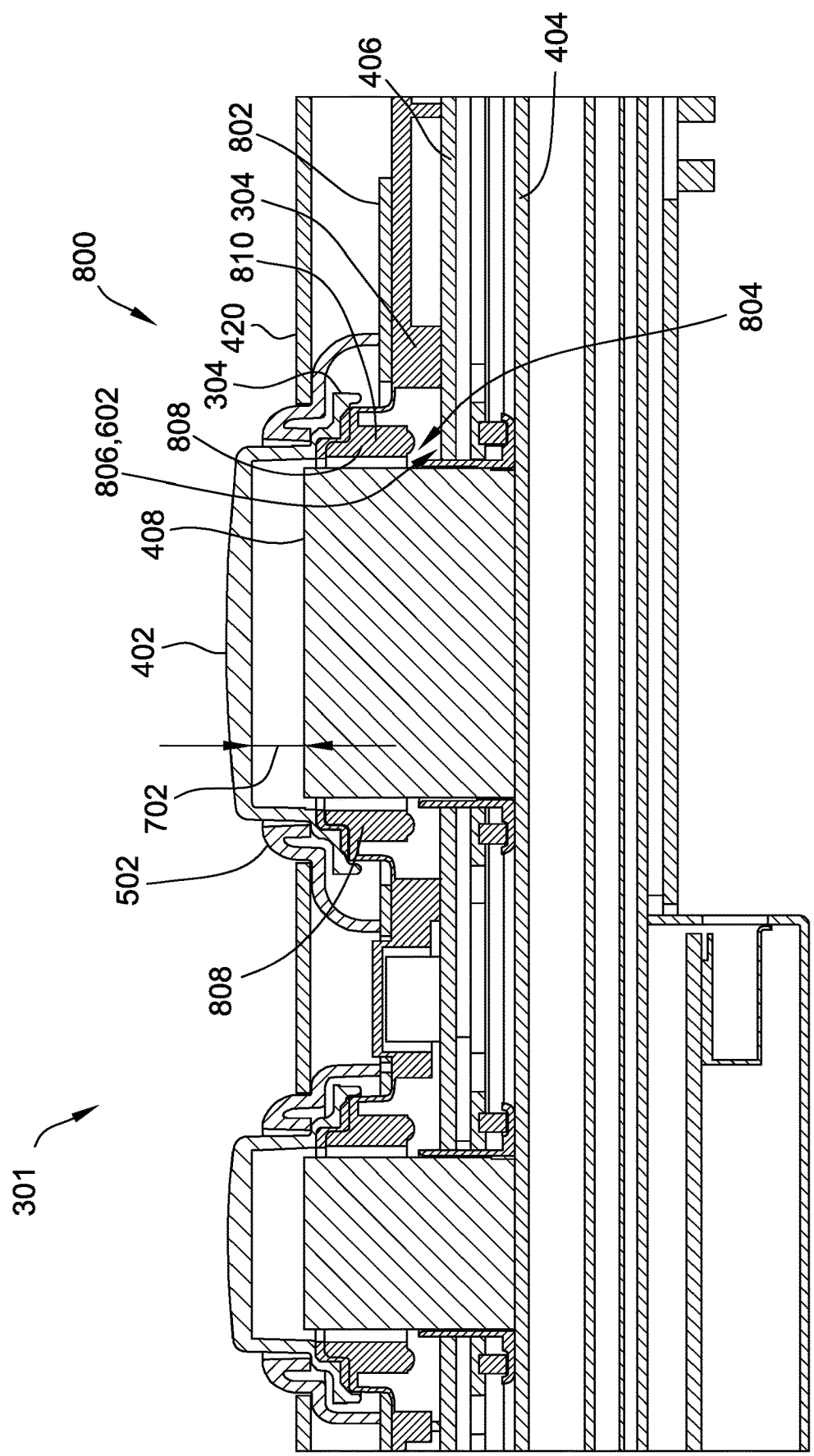

FIG. 7 is a first sectional view of a cross section of button deck assembly 301 taken across line 7-7 (both shown in FIG. 3). FIGS. 8A and 8B are additional sectional views of cross sections of button deck assembly 301 taken across line 7-7. In the exemplary embodiment, and with combined reference to FIGS. 7-8B, an air gap 702 is present between the top of optical block 408 and the underside of lens cap 402. Air gap 702 enables lens cap 402 to move up and down through a limited distance when a player presses down on lens cap 402. In one example, air gap 702 is about 2 millimeters or about 80 thousandths of an inch in length. Thus, lens cap 402 may travel the length of air gap 702 in a downward direction without moving optical block 408. In the exemplary embodiment, optical block 408 is stationary. Optical block 408 does not move when lens cap 402 is depressed. Air gap 702 having a length of about 80 thousandths of an inch does not interfere with the quality of the LCD images transmitted through optical block 408. Alternatively, air gaps 702 may be of any suitable length to accommodate a size and/or shape of optical block 408 and lens cap 402.

During operation, when the player depresses the button 302, the lens cap 402 of the button 302 pushes into lobes 808 of the membrane 304, causing the membrane 304 to begin to deform and be pressed downward toward the PCBA 406. In the example embodiment, carbon pucks (not shown) are attached to a lower lobe edge 804. Once the lobes 808 have been sufficiently deformed by the downward pressure of the lens cap 402, the lower lobe edge 804, and the attached pucks, make contact with an upper surface 806 of the PCBA 406. More specifically, the pucks make contact with the PCT pads 602 on the PCBA 406. This contact causes the button 302 to be activated for its designated function.

An air gap (not separately numbered) is configured between the lower lobe edge 804 and the upper surface 806 of the PCBA 406. In the example embodiment, this air gap is less than the air gap 702, allowing the lobes 808 and their associated pucks to make contact with the PCBA 406 during the press deformation and before the lens cap 402 makes contact with the optical block 408. In some situations, extensive downward pressure on the lens cap 402 can further deform lobes 808, eventually causing the lens cap 402 to make contact with the optical block 408. For example, an excited player may smash the button 302 during game play. Such extensive pressure can be transferred through to the surface of the display panel 404 and may cause the display panel 404 to break or otherwise malfunction. To combat such situations, the button deck assembly 301 may also include a shock plate 802 disposed on an upper surface of the membrane 304. The shock plate 802 may be made of a thin metal or other material sufficiently resistant to deformation. The button lens 402 includes an outer extension 810 that is configured to contact the shock plate 802 during the button press after the lobes 808 and pucks have made contact with the PCBA 406 and before the button lens 402 makes contact with the optical block 408. For example, a distance between the shock plate 802 and the outer extension 810 of the button lens 402 may be configured to be equal to or slightly more than the distance between the lower lobe edge 804 and the upper surface 806 of the PCBA 406, but less than a distance of the air gap 702 (e.g., a distance between the button lens 402 and the optical block 408). As such, during excessive deformation, excess force is transferred from the outer extension 810 of the button lens 402 to the shock plate 802. As the shock plate 802 receives the excess force, the shock plate 802 and the supporting portion of membrane 304 upon which the shock plate 802 rests, may additionally deform to absorb the force. As such, the button deck assembly 301 is further resistant to additional stresses than would otherwise be possible with just the membrane 304 resisting button press force.

Figure 9:
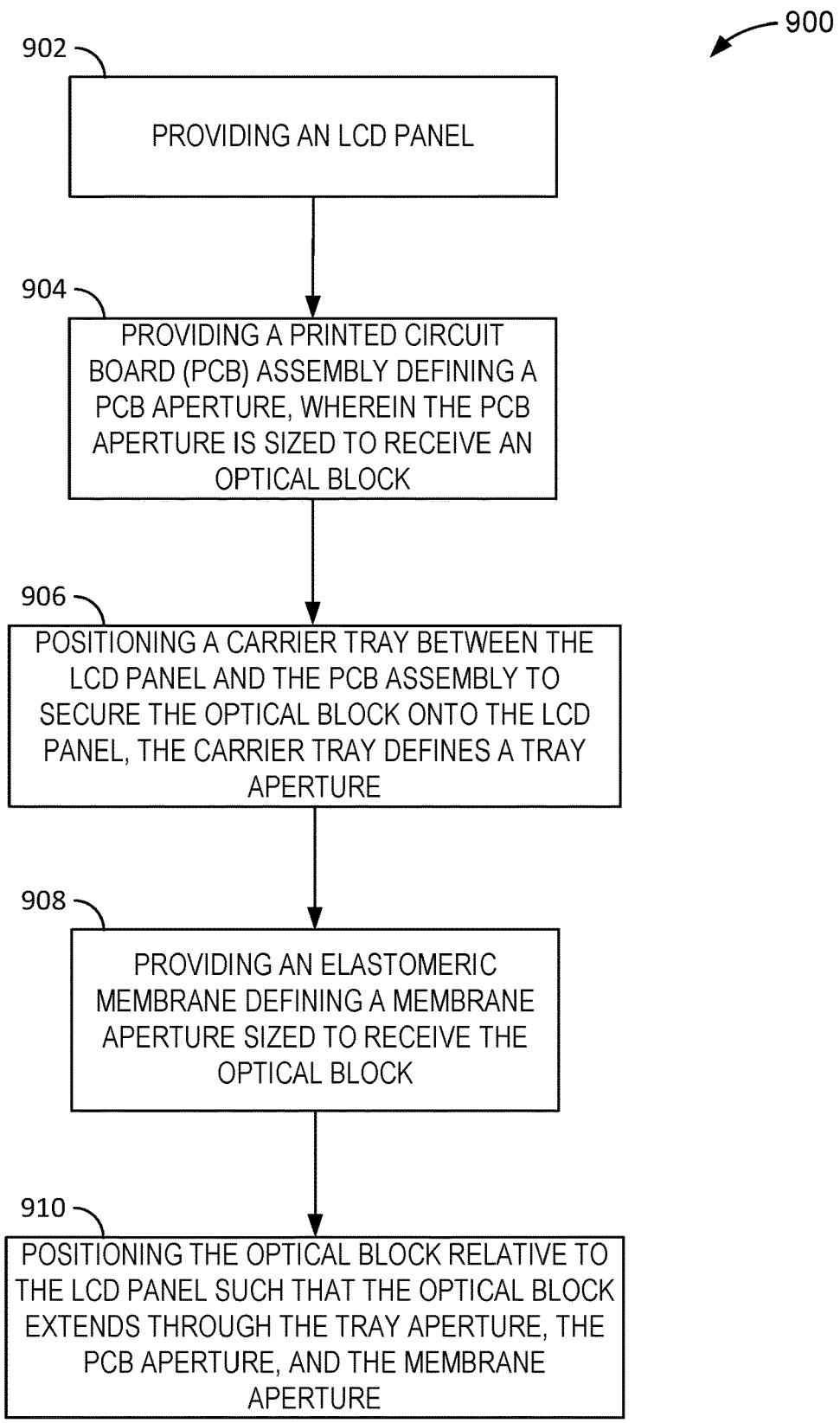
FIG. 9 is a flowchart illustrating an exemplary process for manufacturing the button deck assembly shown in FIG. 3.

FIG. 9 is a flowchart illustrating an exemplary process for manufacturing button deck assembly 301 (shown in FIG. 3). Accordingly, in the exemplary embodiment, display panel 404 may be provided (step 902). Moreover, a printed circuit board (PCB), such as PCBA 406, defining a PCB aperture, such as PCBA aperture 414, may also be provided (step 904). PCB aperture may be sized to receive optical block 408. Carrier tray 410 may be positioned between display panel 404 and PCBA 406 to secure optical block 408 onto display panel 404 (step 906). Elastomeric membrane 304 defining a membrane aperture sized to receive optical block 408, such as membrane aperture 416, may also be provided (step 908). Optical block 408 may be attached to display panel 404, such that optical block 408 extends through tray aperture 412 of carrier tray 410, PCBA aperture 414, and membrane aperture 416 of elastomeric membrane 304.

While the invention has been described with respect to the figures, it will be appreciated that many modifications and changes may be made by those skilled in the art without departing from the spirit of the invention. Any variation and derivation from the above description and figures are included in the scope of the present invention as defined by the claims.

What is claimed is:

1. An optical assembly for an electronic gaming device, the optical assembly comprising:
    an optical component configured to enable transmission of images therethrough; and
    a membrane comprising water-resistant material, wherein the membrane is configured to receive at least a portion of the optical component and is configured to route fluid flow away from electronic components of the electronic gaming device including the optical component, wherein the membrane extends around at least one of a printed circuit board assembly (PCBA) or a carrier tray, and wherein the membrane comprises at least one of a valley, a channel, or a groove to prevent infiltration of the fluid flow to the at least one of the PCBA or the carrier tray.

2. The optical assembly of claim 1, wherein the membrane is configured to route the fluid flow down at least one of a front surface of the membrane or a back surface of the membrane.

3. The optical assembly of claim 1, wherein the membrane is configured to route the fluid flow into at least one drop tray.

4. The optical assembly of claim 1, wherein the water-resistant material comprises silicon.

5. The optical assembly of claim 1, wherein the optical assembly is included in a button deck assembly, the button deck assembly comprising a button deck and a display panel.

6. The optical assembly of claim 5, wherein the optical component is configured to enable transmission of images from the display panel therethrough.

7. The optical assembly of claim 5, wherein the membrane routes fluid flow from a top surface of the button deck assembly around at least one electronic component of the button deck assembly.

8. A method for routing fluid flow away from at least one component in an electronic gaming device, the method comprising:
    positioning at least a portion of an optical component within an aperture of a membrane, wherein the optical component is configured to enable transmission of images therethrough, wherein the membrane comprises water-resistant material, and wherein the membrane is configured to receive at least the portion of the optical component; and
    routing, by the membrane, fluid flow away from the at least one component in the electronic gaming device, the at least one component including the optical component, wherein the membrane is configured to route the fluid flow away from the at least one component in the electronic gaming device including the optical component, wherein the membrane extends around at least one of a printed circuit board assembly (PCBA) or a carrier tray, and wherein the membrane comprises at least one of a valley, a channel, or a groove to prevent infiltration of the fluid flow to the at least one of the PCBA or the carrier tray.

9. The method of claim 8, further comprising providing the optical component and the membrane in a button deck assembly of the electronic gaming device.

10. The method of claim 9, wherein the membrane routes fluid flow from a top surface of the button deck assembly around at least one electronic component of the button deck assembly.

11. The method of claim 8, wherein the membrane is configured to route the fluid flow down at least one of a front surface of the membrane or a back surface of the membrane.

12. The method of claim 8, wherein the membrane is configured to route the fluid flow into at least one drop tray.

13. The method of claim 8, wherein the water-resistant material comprises silicon.

14. An electronic gaming device comprising:
   an optical component configured to enable transmission of images therethrough; and
   a membrane comprising water-resistant material, wherein the membrane is configured to receive at least a portion of the optical component and is configured to route fluid flow away from electronic components of the electronic gaming device including the optical component, wherein the membrane extends around at least one of a printed circuit board assembly (PCBA) or a carrier tray, and wherein the membrane comprises at least one of a valley, a channel, or a groove to prevent infiltration of the fluid flow to the at least one of the PCBA or the carrier tray.

15. The electronic gaming device of claim 14, wherein the membrane is configured to route the fluid flow down at least one of a front surface of the membrane or a back surface of the membrane.

16. The electronic gaming device of claim 14, wherein the membrane is configured to route the fluid flow into at least one drop tray.

17. The electronic gaming device of claim 14, wherein the water-resistant material comprises silicon.

18. The electronic gaming device of claim 14, wherein the optical component is included in a button deck assembly, the button deck assembly comprising a button deck and a display panel.

19. The electronic gaming device of claim 18, wherein the optical component is configured to enable transmission of images from the display panel therethrough.

20. The electronic gaming device of claim 18, wherein the membrane routes fluid flow from a top surface of the button deck assembly around at least one electronic component of the button deck assembly.

\* \* \* \* \*